United States Patent
Takahashi (10) Patent No.: US 8,179,023 B2
(45) Date of Patent: May 15, 2012

(54) PACKAGE-TYPE PIEZOELECTRIC RESONATOR AND METHOD OF MANUFACTURING PACKAGE-TYPE PIEZOELECTRIC RESONATOR

(75) Inventor: Takehiro Takahashi, Sayama (JP)

(73) Assignee: Nihon Dempa Kogyo, Co., Ltd., Tokyo (JP)

( * ) Notice: Subject to any disclaimer, the term of this patent is extended or adjusted under 35 U.S.C. 154(b) by 0 days.

(21) Appl. No.: 12/449,533

(22) PCT Filed: Feb. 19, 2008

(86) PCT No.: PCT/JP2008/053126
§ 371 (c)(1),
(2), (4) Date: Aug. 12, 2009

(87) PCT Pub. No.: WO2008/102900
PCT Pub. Date: Aug. 28, 2008

(65) Prior Publication Data
US 2010/0117489 A1    May 13, 2010

(30) Foreign Application Priority Data
Feb. 20, 2007  (JP) ................. 2007-039760

(51) Int. Cl.
*H01L 41/08*   (2006.01)
(52) U.S. Cl. ..................................... 310/348
(58) Field of Classification Search ........... 310/344, 310/364–366, 368, 348, 324, 320, 367, 321; H01L 41/08, 41/09; H03H 03/02
See application file for complete search history.

(56) References Cited

U.S. PATENT DOCUMENTS

| | | | | |
|---|---|---|---|---|
| 4,639,631 A | * | 1/1987 | Chason et al. | 310/344 |
| 5,925,973 A | * | 7/1999 | Eda et al. | 310/348 |
| 6,087,759 A | * | 7/2000 | Pfeil | 310/321 |

FOREIGN PATENT DOCUMENTS

| | | |
|---|---|---|
| JP | 8-335839 | 12/1996 |
| JP | 10-209795 | 8/1998 |
| JP | 10-209799 | 8/1998 |
| JP | 2000-068780 | 3/2000 |
| JP | 2006-180168 | 7/2006 |

* cited by examiner

*Primary Examiner* — Thomas Dougherty
*Assistant Examiner* — Karen B Addison
(74) *Attorney, Agent, or Firm* — Jordan and Hamburg LLP (57) ABSTRACT

Provided is a package-type piezoelectric sensor which can be packaged at a wafer stage and which is suitable for mass production. A package-type quartz resonator has lead electrodes that are interposed in a close contact state, between on one side stepped surfaces, and on another side a lower surface of a frame portion of a piezoelectric substrate. The close contact state is maintained when a base is joined to a lower surface side of the piezoelectric substrate. By joining a cover to an upper surface side of the piezoelectric substrate and joining the base to the lower surface side of the piezoelectric substrate, the piezoelectric substrate may be easily sealed to be airtight. In particular, a space in a recessed portion of the base is sealed airtight. This enables avoidance of complications in the manufacturing process.

6 Claims, 6 Drawing Sheets

PRIOR ART

Fig. 8

PRIOR ART

PACKAGE-TYPE PIEZOELECTRIC RESONATOR AND METHOD OF MANUFACTURING PACKAGE-TYPE PIEZOELECTRIC RESONATOR

TECHNICAL FIELD

The present invention relates to a package-type piezoelectric resonator in which a vibrating portion is provided in a space airtightly sealed by a cover and a base, and to a method of manufacturing the same.

BACKGROUND ART

Figure 7:
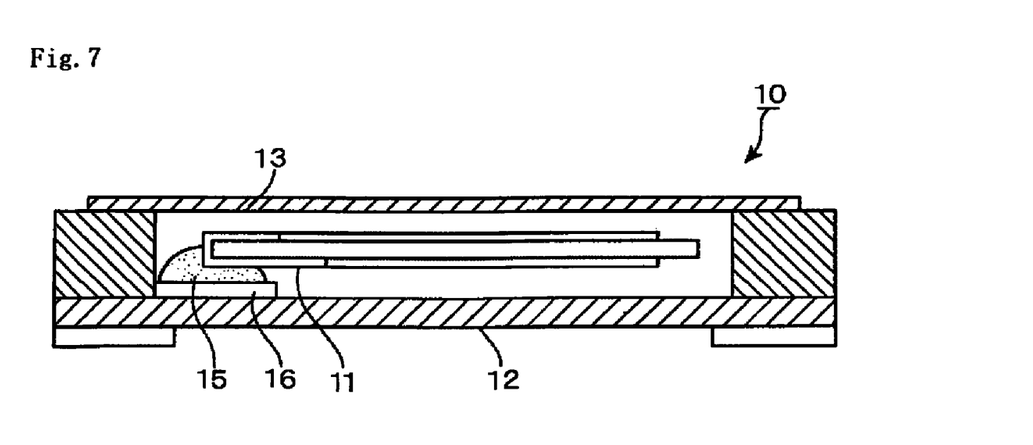
FIG. 7 is a schematic cross-sectional view showing a conventional package-type quartz resonator.
Figure 8:
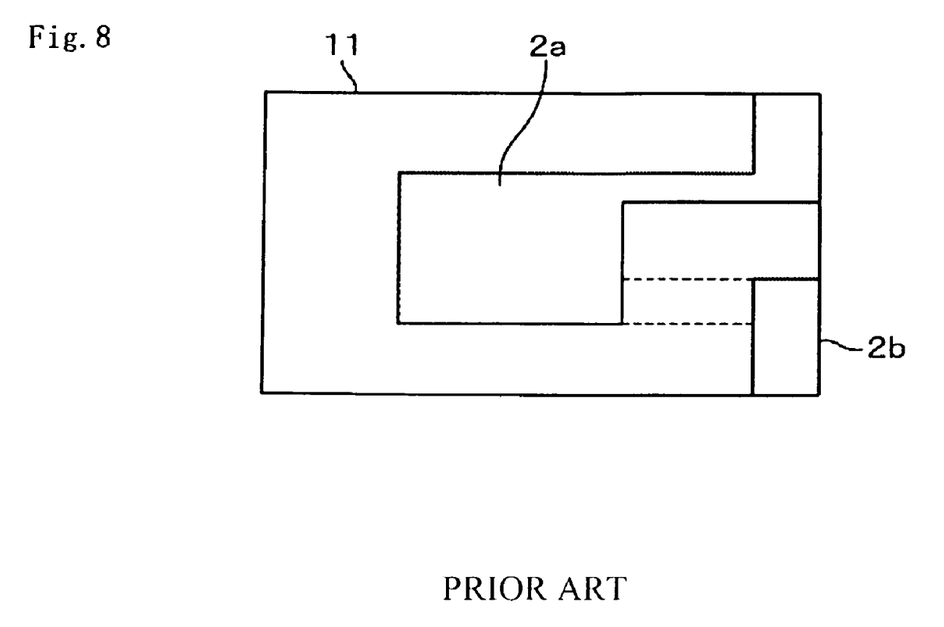
FIG. 8 is a schematic plane view showing a quartz crystal blank.

A conventional package-type quartz resonator is structured such that a quartz crystal blank 11 on whose both main surfaces electrodes 2a, 2b are formed in the same pattern as shown in FIG. 8 is housed in a package 10 which is composed of a ceramic base 12 and a metal cover 13 as shown in FIG. 7. The base 12 and the cover 13 are seam-welded via a sealing member made of, for example, a welding material, and the inside thereof is in a vacuum state.

A method of manufacturing the aforesaid package-type quartz resonator will be briefly described. First, a quartz wafer is prepared in which a plurality of quartz crystal blank 11 which are rectangular as shown in FIG. 8 are arranged in vertical and lateral directions. Subsequently, the quartz wafer is cut along contours of the quartz crystal blank 11 by dicing or the like to be divided into individual pieces. Then, the individually separated quartz crystal blank 11 are placed one by one via a conductive adhesive 15 in a plurality of recessed portions formed in a front surface of the ceramic base. After all the quartz crystal blank 11 are placed on the ceramic base, the cover 16 is bonded on the ceramic base via the sealing member, and the sealing member portion is heated so that the cover 16 is fixed to the front surface of the ceramic base. Thereafter, this stack is cut by dicing or the like along division lines formed on a front surface of the stack, whereby the package-type quartz resonators shown in FIG. 7 are completed.

In the above-described method of manufacturing the package-type quartz resonator, however, since the quartz crystal blank 11 are placed one by one in the recessed portions of the ceramic base after the quartz crystal blank 11 are cut out from the quartz wafer, it takes long time to place all the quartz crystal blank 11 on the ceramic base and hence manufacturing efficiency is low. Further, it is difficult to transport the small quartz crystal blank 11. That is, this method is not suitable for mass production of the package-type quartz resonator.

Further, since the base 12 and the cover 13 are made of different kinds of materials, their difference in thermal expansion coefficient causes a distortion between the base 12 and the cover 13 to lower bonding strength when the cover 13 seals (is joined to) the base 12, which sometimes prevents high airtightness. Further, as shown in FIG. 7, since the quartz crystal blank 11 is fixed on a front surface of a pedestal 16 of the base 12 via the conductive adhesive 15, gas is generated from the conductive adhesive 15 during annealing, and this released gas is filled in the package 10 to fluctuate or deteriorate a characteristic of the quartz crystal blank 11.

Therefore, there has been proposed an art in which a stack is formed by the packaging at the wafer stage where the plural elements are simultaneously formed, and the stack is cut along predetermined lines, whereby packaged elements are produced (see a patent document 1). However, since the whole peripheries of wafers are sealed (joined) by anodic bonding using aluminum (Al) and molybdenum (Mo) at the time of the packaging, there is a problem that electrodes connecting the elements and external terminals cannot be led out via a joint surface. Further, forming through holes on a bottom surface of the stack so as to allow the electrodes to be led out via the through holes is not advisable since this requires a process of sealing the through holes communicating with a space inside the stack and increases the number of processes. Therefore, though being an appropriate method in view of the mass production of the package-type quartz resonator, the patent document 1 gives no consideration to how the electrodes connecting the elements and the external terminals should be led out and how the sealing should be done, in actual mass-produced products.

A patent document 2 describes that a quartz resonator is airtightly sealed in the following manner. First, excitation electrodes are formed on a front and a rear surface of a vibration plate having a vibrating portion in a tongue piece shape, and lead electrodes are led out from the excitation electrodes via a root portion of the vibrating portion. One of the lead electrodes forms a first connection part and the other lead electrode penetrates to the one lead electrode side to thereafter form a second connection part, and a first cover of quartz crystal and having through holes is joined to one surface of the vibration plate. The first and second connection parts are electrically connected via the through holes provided in the first cover to conduction electrodes formed on inner surfaces of the through holes. Subsequently, a second cover of quartz crystal is joined to the other surface of the vibration plate to form a package, and sealing electrodes are formed so as to cover the conduction electrodes formed on the inner surfaces of the through holes of the first cover, so that the package is airtightly sealed.

Further, the vibration plate has a large thickness in its portion sandwiched by the first cover and the second cover, and its portions such as portions where the vibrating portion and the lead electrodes are formed are made small by etching. Consequently, in the state in which the vibration plate is sandwiched by the first cover and the second cover, it is prevented that a gap is formed between the vibration plate and the first cover or the second cover due to the thickness of the lead electrodes formed on the surfaces of the vibration plate. That is, by thus forming the vibration plate, high airtightness of the package-type quartz resonator is realized. However, in fabricating the package-type quartz resonator, this method requires working of the vibration plate to make its portion sandwiched by the first cover and the second cover thick and to make its portions such as the portions where the vibrating portion and the lead electrodes are formed thin, resulting in an increased number of processes for manufacturing the package-type quartz resonator. Further, since the thickness of the portions where the vibrating portion and the lead electrodes are formed are made small, there is also a problem that the vibration plate is easily broken when it is handled.

Patent Document 1
Japanese Patent Application Laid-open No. 2006-180168 (paragraph 0012 and FIG. 1)
Patent Document 2
Japanese Patent Application Laid-open No. Hei 8-335839 (paragraph 0012, FIG. 2, FIG. 3, and FIG. 6)

DISCLOSURE OF THE INVENTION

The present invention was made under such circumstances, and has an object to provide a package-type piezoelectric resonator that can be packaged at a wafer stage and is suitable for mass production, and a method of manufacturing the same.

The present invention is a package-type piezoelectric resonator in which a vibrating portion is provided in a space airtightly sealed by a cover and a base, the piezoelectric resonator including:

a piezoelectric substrate in which the vibrating portion and a frame portion surrounding the vibrating portion via a gap are integrally formed via a support portion;

one excitation electrode and another excitation electrode formed on one surface side and another surface side of the vibrating portion respectively;

one lead electrode connected to the one excitation electrode and led out from the one surface side of the vibrating portion to the frame portion on the other surface side of the piezoelectric substrate via the support portion;

another lead electrode connected to the other excitation electrode and led out to the frame portion on the other surface side of the piezoelectric substrate via the support portion;

the cover having a recessed portion housing the vibrating portion and the support portion; and the base having a recessed portion housing the vibrating portion and the support portion, wherein:

the base has: stepped surfaces which are formed at portions facing the one and other lead electrodes in a frame portion surrounding the recessed portion of the base so as to be lower than an upper surface of the frame portion by a thickness of the lead electrodes; through holes formed at is positions, in the stepped surfaces, not communicating with a space in the recessed portion of the base so as to be opened in an outer surface of the base; and conduction electrodes formed on inner wall surfaces of the through holes to electrically connect external electrodes and the lead electrodes; and the lead electrodes are interposed between the stepped surfaces and a lower surface of the frame portion of the quartz substrate in a close contact state, thereby airtightly sealing a space where the vibrating portion is located.

In the above-described package-type piezoelectric resonator, the piezoelectric substrate, the cover, and the base each are preferably made of quartz crystal. Further, an insulating member or a conductive member is preferably buried in each of the through holes. Further, the external electrodes are preferably provided on the outer surface of the base.

Another aspect of the present invention is a method of manufacturing the above-described package-type piezoelectric resonator, the method including:

by using a first wafer made of a piezoelectric material having a large number of substrate regions in each of which the vibrating portion and a frame portion formation region to be the frame portion surrounding the vibrating portion via the gap are integrally formed via the support portion, forming the one excitation electrode and the other excitation electrode on the one surface side and the other surface side of the vibrating portion respectively, and forming the one lead electrode which is connected to the one excitation electrode and is led out from the one surface side of the vibrating portion to the frame portion on the other surface side of the piezoelectric substrate via the support portion and the other lead electrode which is connected to the other excitation electrode and is led out to the frame portion on the other surface side of the piezoelectric substrate via the support portion;

forming, on a second wafer, a large number of regions each of which is to be the cover having the recessed portion housing the vibrating portion and the support portion, so as to correspond to an arrangement pattern of the substrate regions of the first wafer;

forming, on a third wafer, a large number of regions each of which is to be the base having the recessed portion housing the vibrating portion and the support portion, so as to correspond to the arrangement pattern of the substrate regions of the first wafer, forming the stepped surfaces which are formed lower than an upper surface of a region to be the frame portion by the thickness of the lead electrodes, at portions facing the one and other lead electrodes in each of the regions to be the frame portion surrounding the recessed portion of the base; and forming the through holes opened in the outer surface of each of the bases, at positions, in the stepped surfaces, not communicating with the space in the recessed portion of the base;

joining the second wafer and the third wafer on an upper surface and a lower surface of the first wafer respectively in a stacked manner, while aligning the vibrating portions of the second wafer, the recessed portions of the first wafer, and the recessed portions of the third wafer to one another;

thereafter forming, in the through holes of the third wafer, the conduction electrodes electrically connecting the lead electrodes and the external electrodes, and forming the external electrodes of each of the package-type piezoelectric resonators, on a surface opposite the recessed portions of the third wafer; and thereafter cutting a stack of the wafers to divide the stack into the package-type piezoelectric resonators.

Further, the above-described method of manufacturing the package-type piezoelectric resonator may further include: after forming the conduction electrodes, burying insulating members or conductive members in the through holes; and thereafter providing electrode pads electrically connected to the conduction electrodes on the outer surface of each of the bases so as to cover the through holes.

The package-type piezoelectric resonator of the present invention is suitable for mass production since the packaging at the wafer stage is possible. In the package-type piezoelectric resonator, when the base is joined to the lower surface side of the piezoelectric substrate, the lead electrodes are interposed between the stepped surfaces and the lower surface of the frame portion of the piezoelectric substrate in a close contact state, so that the space of the recessed portion of the base is airtightly sealed. Therefore, only by joining the cover to the upper surface side of the piezoelectric substrate and joining the base to the lower surface side of the piezoelectric substrate, it is possible to easily airtightly seal the piezoelectric substrate, which can avoid the complication of the manufacturing processes.

BEST MODE FOR CARRYING OUT THE INVENTION

Figure 1:
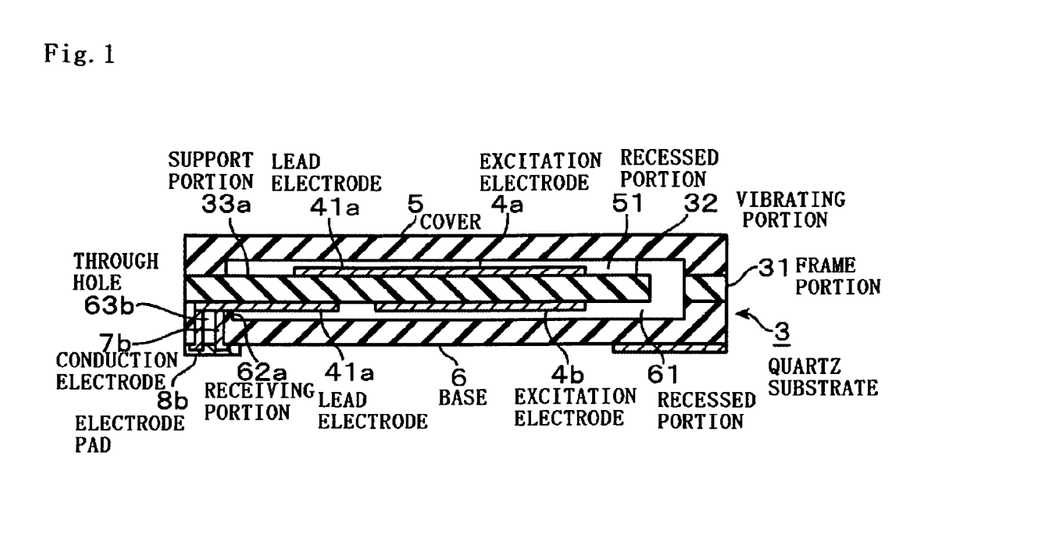
FIG. 1 is a schematic cross-sectional view showing a package-type quartz resonator of the present invention.

The structure of a package-type quartz resonator according to an embodiment of the present invention will be described with reference to FIG. 1 to FIG. 4. FIG. 1 is a schematic view showing a cross section of a cover 5 taken along the A-A' line in FIG. 3, a cross section of a quartz substrate 3 taken along the B-B' line in FIG. 3, and a cross section of a base 6 taken along the C-C' line in FIG. 3. In the drawings, 3 denotes the rectangular quartz substrate, and the quartz substrate 3 includes a frame portion 31 and a vibrating portion 32 located on an inner side of the frame portion 31 via a space. These frame portion 31 and vibrating portion 32 are integrally formed via two support portions 33a, 33b which are arranged side by side on one end side of the quartz substrate 3 to be apart from each other in a width direction. On one surface side and another surface side of the vibrating portion 32, one excitation electrode 4a and another excitation electrode 4b are formed respectively. Further, on the one side surface of the vibrating portion 32, one lead electrode 41a is formed with one side end thereof being connected to the one excitation electrode 4a.

Figure 3:
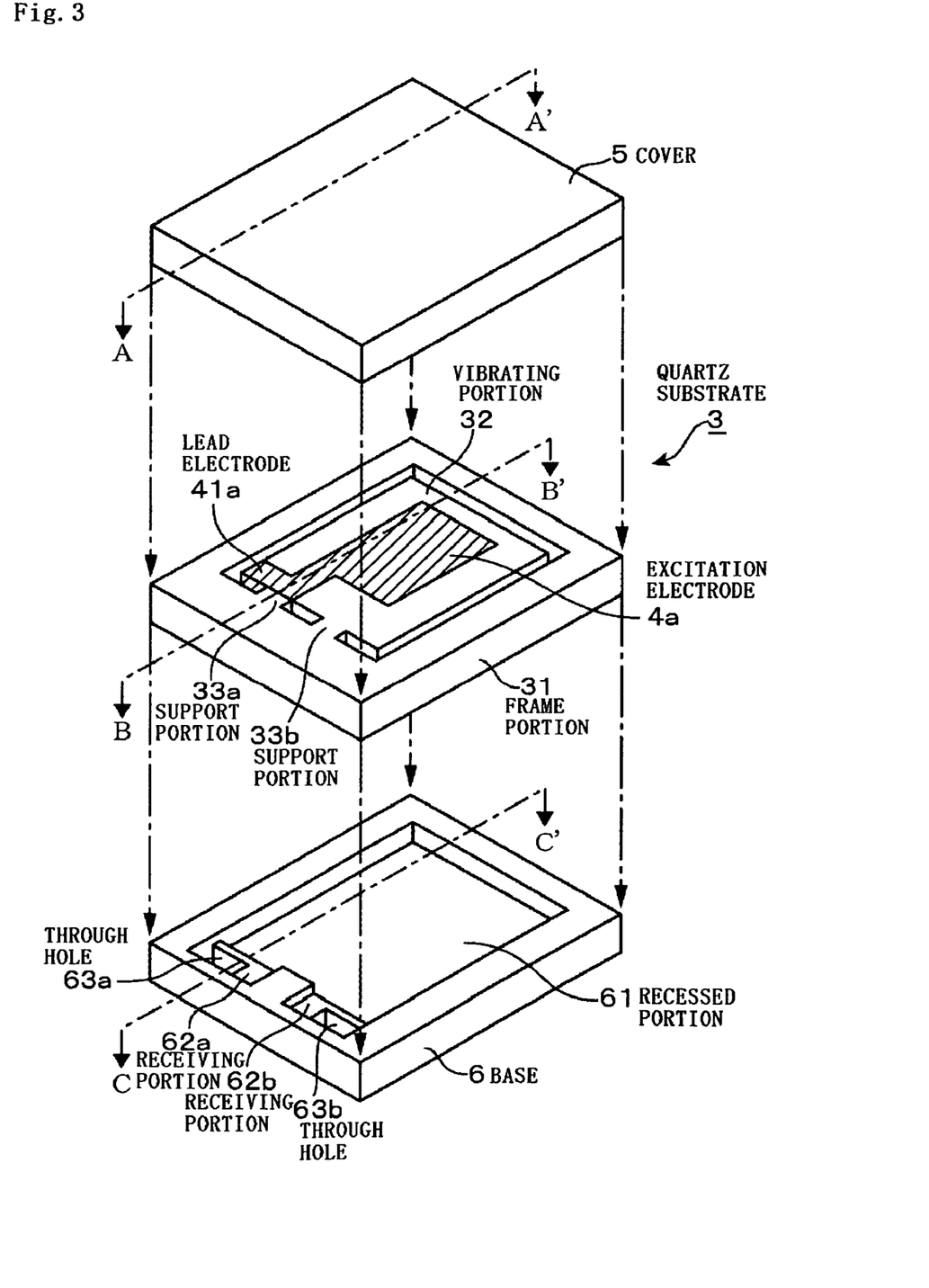
FIG. 3 is a schematic perspective view showing the package-type quartz resonator of the present invention.
Figure 4:
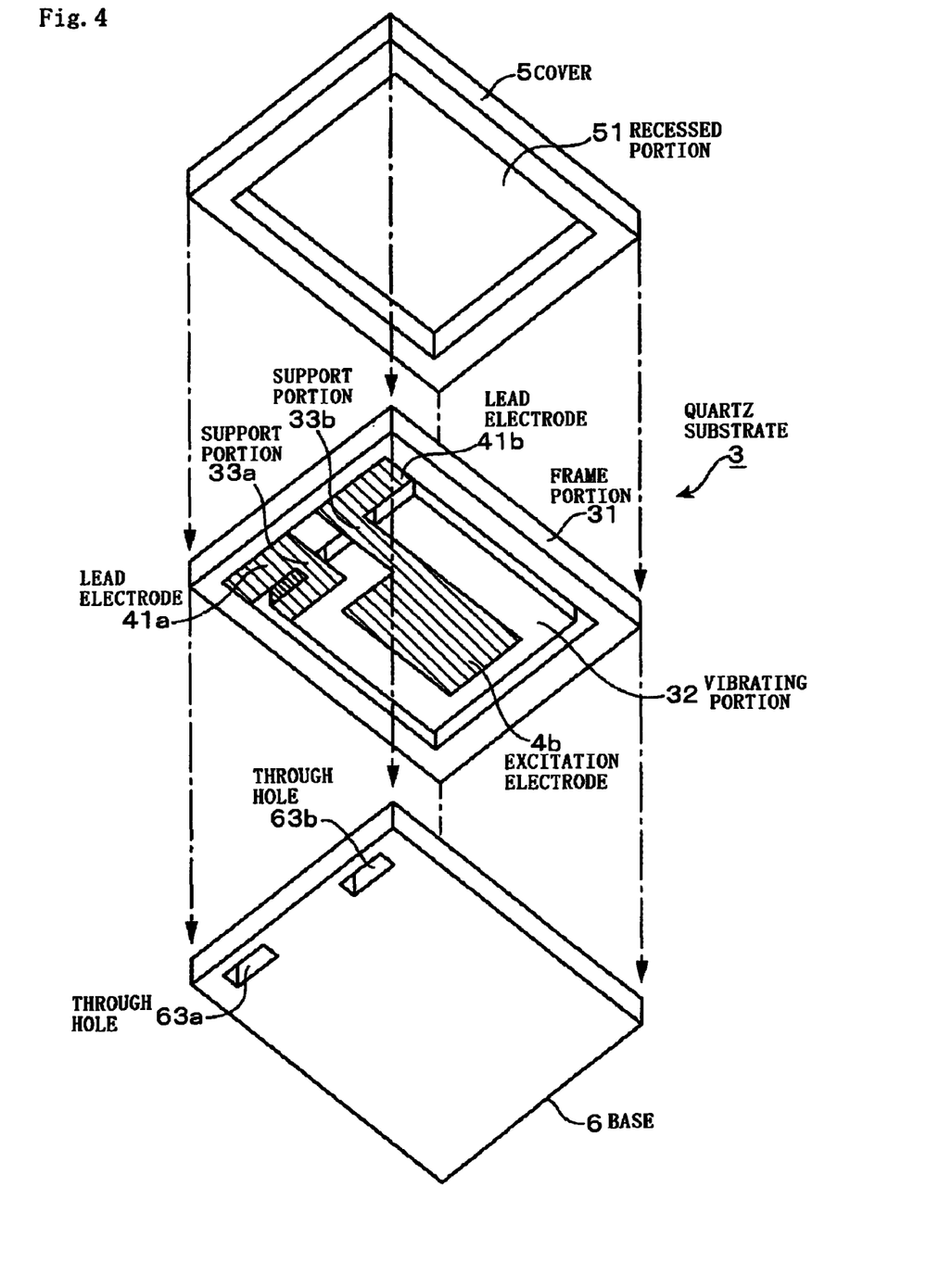
FIG. 4 is a schematic perspective view showing the package-type quartz resonator of the present invention.

As shown in FIG. 3 and FIG. 4, the lead electrode 41a is led out in a belt shape from the excitation electrode 4a to one edge side of the vibrating portion 32, is bent along an end surface of the vibrating portion 32, is led to the other surface side of the vibrating portion 32, and is further led out to the frame portion 31 on the other surface side of the quartz substrate 3 via the support portion 33a. On the other surface side of the vibrating portion 32, the other lead electrode 41b is formed with its one end side being connected to the other excitation electrode 4b. As shown in FIG. 4, the lead electrode 41b is led out in a belt shape from the excitation electrode 4b to one edge side of the vibrating portion 32, and is further led out to the frame portion 31 on the other surface side of the quartz substrate 3 via the support portion 33b. The excitation electrodes 4a, 4b and the lead electrodes 41a, 41b are each formed by the vapor deposition or sputtering of a laminate film having a Cr film on a lower layer and an Au film on a upper layer.

On an upper side of the quartz substrate 3, there is provided the rectangular cover 5 made of quartz crystal and having a recessed portion 51 housing the vibrating portion 32 and the support portions 33a, 33b. The cover 5 is joined to the frame portion 31 on the one surface side of the quartz substrate 3 by solder such as AuSi, AuS, AuGe, or the like.

On a lower side of the quartz substrate 3, there is provided the rectangular base 6 made of quartz crystal and having a recessed portion 61 housing the vibrating portion 32 and the support portions 33a, 33b. As shown in FIG. 3, on one edge side of the recessed portion 61 of the base 6, receiving portions 62a, 62b in a recessed shape are formed so as to house the lead electrode 41a and the other lead electrode 41b formed on the frame portion 31 on the other surface side of the quartz substrate 3. That is, in an upper surface of one end side of the base 6, regions corresponding to the lead electrodes 41a, 41b are made lower by the thickness of the lead electrodes 41a, 41b and are formed as stepped surfaces. The stepped surfaces correspond to bottom surfaces of the receiving portions 62a, 62b. The base 6 is joined to the frame portion 31 on the other surface side of the quartz substrate 3 by solder such as AuSi, AuS, or AuGe, so that the lead electrode 41a is housed in the receiving portion 62a and the lead electrode 41b is housed in the receiving portion 62b as shown in FIG. 1. In this example, as shown in the enlarged view of an essential part in FIG. 2, a depth of the receiving portions 62a, 62b is set equal to the thickness of the lead electrodes 41a, 41b. Owing to this structure, when the frame portion 31 on the other surface side of the quartz substrate 3 is joined to the base 6, bulging portions ascribable to the lead electrodes 4a, 4b are eliminated between the quartz substrate 3 and the base 6, so that joint surfaces of the quartz substrate 3 and the base 6 become flush with each other and the receiving portions 62a, 62b and the lead electrodes 4a, 4b come into close contact with each other.

Figure 2:
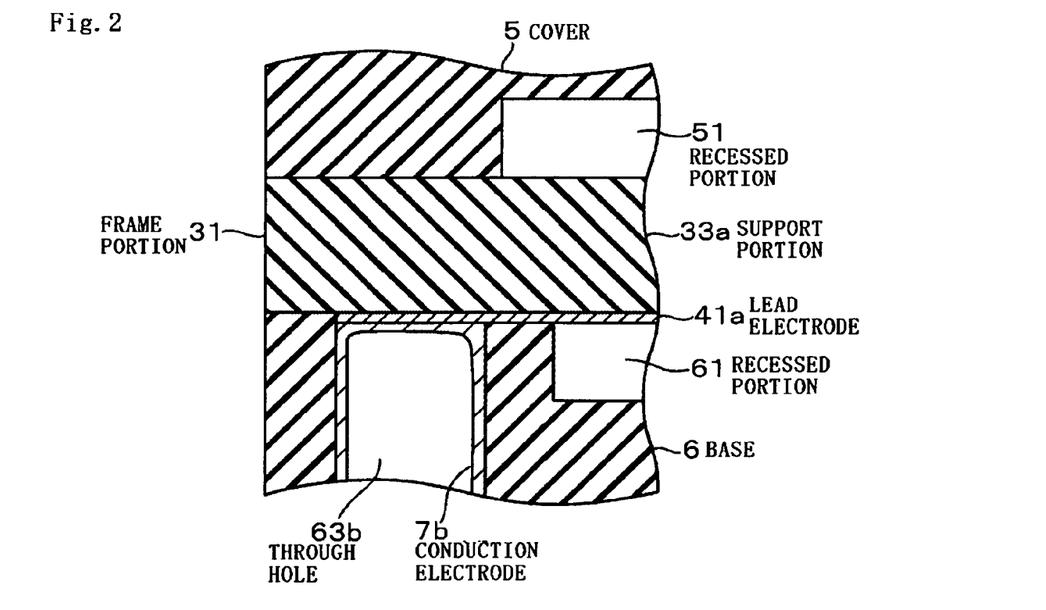
FIG. 2 is an enlarged view showing an essential part of the package-type quartz resonator of the present invention.

Further, as shown in FIG. 2, FIG. 3, and FIG. 4, in the receiving portions 62a, 62b, through holes 63a, 63b passing through the base 6 in its thickness direction are formed. On inner circumferential surfaces of the through holes 63a, 63b, conduction electrodes 7a, 7b are formed as shown in FIG. 2. The conduction electrodes 7a, 7b are each formed by the vapor deposition or sputtering of a laminate film having a Cr film on a lower layer and an Au film on an upper layer. Consequently, as shown in FIG. 1 and FIG. 2, the conduction electrodes 7a, 7b are electrically connected to the lead electrode 41a and the other lead electrode 41b formed on the frame portion 31 on the other surface side of the quartz substrate 3, respectively. Further, the conduction electrodes 7a, 7b are formed so as to be led out to an outer bottom surface of the base 6 via inner wall surfaces of the through holes 63a, 63b, and the conduction electrodes 7a, 7b formed on the outer bottom surface of the base 6 are electrically connected to later-described electrode pads 8a, 8b. Incidentally, the conduction electrodes 7a 7b may be formed so as to be led out to lower end portions of the through holes 63a, 63b, and the conduction electrodes 7a, 7b formed on the lower end portions of the through holes 63a, 63b may be electrically connected to the later-described electrode pads 8a, 8b. Here, the through holes 63a, 63b are formed at positions not communicating with a space surrounded by the recessed portion 61 when the quartz substrate 3 is placed on the base 6, and therefore, in the receiving portions 62a, 62b, the upper surfaces (stepped surfaces) of the portions where the through holes 63a, 63b are formed function as sealing surfaces airtightly sealing the space in the recessed portion 61 by coming into close contact with the lead electrodes 41a, 41b.

Further, in this embodiment, the depth of the receiving portions 62a, 62b is set equal to the thickness of the lead electrodes 41a, 41b, but the depth of the receiving portions 62a, 62b may be set slightly smaller than the thickness of the lead electrodes 41a, 41b. In this case, the lead electrodes 41a, 41b protruding from the upper surfaces of the receiving portions 62a, 62b are crushed to spread due to a stress applied when the quartz substrate 3 is joined to the base 6, which enhances adhesiveness between the quartz substrate 3 and the base 6.

Further, on the outer bottom surface of the base 6, the electrode pads 8a, 8b which are the external electrodes are formed so as to cover the through holes 63a, 63b as shown in FIG. 1, and are electrically connected to the conduction electrodes 7a, 7b formed on the outer bottom surface of the base 6, respectively, as previously described.

The oscillation operation of the package-type quartz resonator as structured above is caused when voltage is applied to the excitation electrodes 4a, 4b of the vibrating portion 32 via the electrode pads 8a, 8b provided on the outer bottom surface of the base 6, the conduction electrodes 7a, 7b, and the lead electrodes 41a, 41b.

Figure 5:
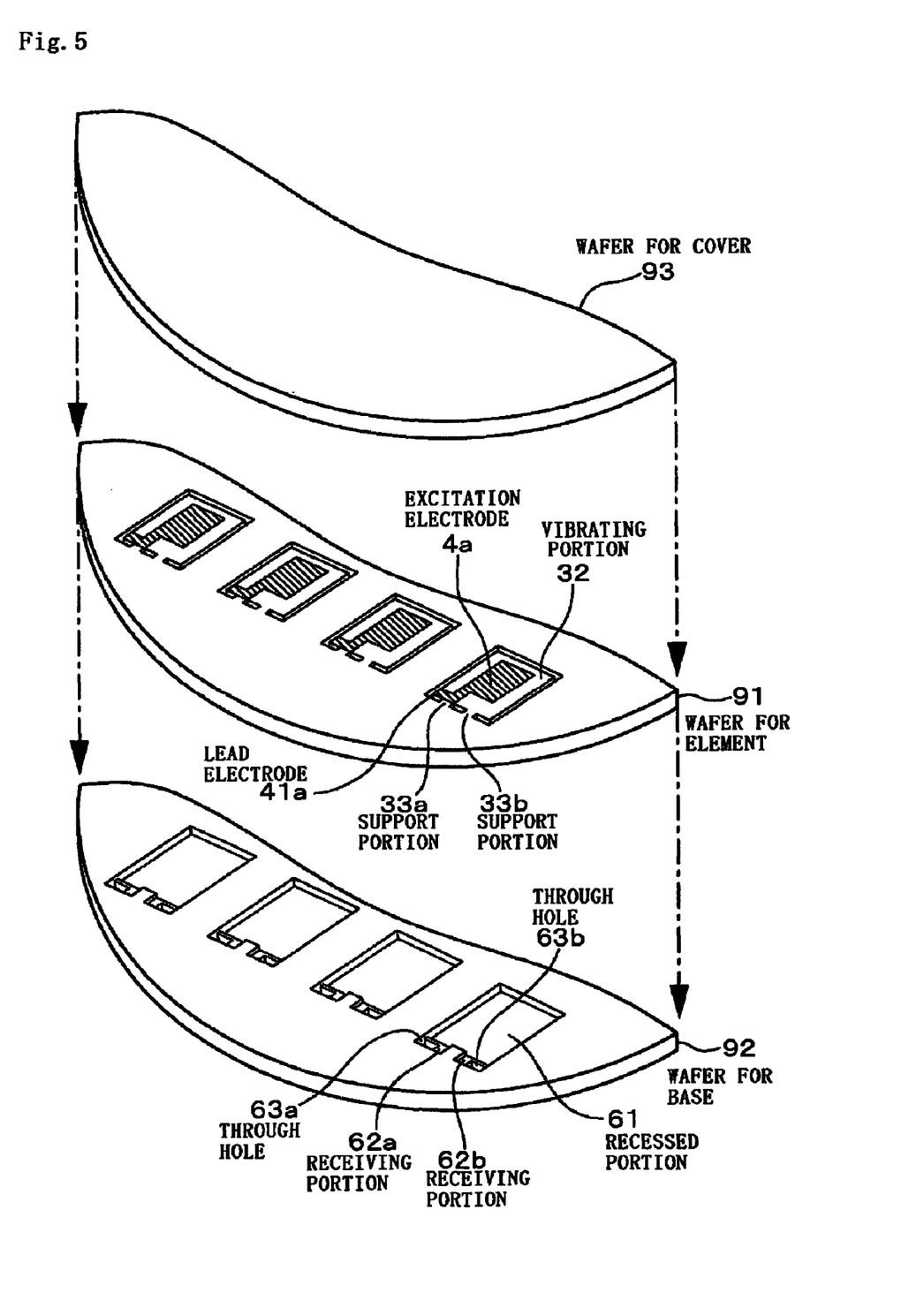
FIG. 5 is a schematic perspective view showing how a cover, a quartz substrate, and a case are stacked.

Next, a method of manufacturing the above-described package-type quartz resonator will be described with reference to FIG. 5 and FIG. 6. To manufacture the above-described package-type quartz resonator, three wafers, namely, a wafer 91 for element, a wafer 92 for base, and a wafer 93 for cover are used as shown in FIG. 5. On the wafer 91 for element, the vibrating portion 32 and the two support portions 33a, 33b supporting the vibrating portion 32 are formed by etching or the like in a matrix arrangement. On both main surfaces of each of the vibrating portions 32, the excitation electrodes 4a, 4b are formed respectively by vapor deposition or sputtering. Further, on the other surface side of each of the support portions 33a and on the other surface side of each of the vibrating arm portions 32, the lead electrode 41a is formed, and on the other surface side of each of the support portions 33b and on the other surface side of each of the vibrating arm portions 32, the lead electrode 41b is formed. On the wafer 92 for base, the recessed portions 61 are formed by etching or the like in a matrix arrangement. Further, on one edge side of each of the recessed portions 61, the receiving portions 62a, 62b in the recessed shape for housing the lead electrodes 41a, 41b formed on the other surface side of the wafer 91 for element are formed by etching or the like. Further, in the receiving portions 62a, 62b, the through holes 63a, 63b are formed respectively by etching or the like. On the wafer 93 for cover, the recessed portions 51 are formed by etching or the like in a matrix arrangement.

First, on a front surface of the wafer 92 for base, solder such as AuSi, AuS, or AuGe is deposited on regions except the regions where the recessed portions 61 are formed. Thereafter, the wafer 91 for element is bonded on the front surface of the wafer 92 for base in a vacuum atmosphere, whereby the vibrating portions 32 and the support portions 33a, 33b formed on the wafer 91 for element are housed in the recessed portions 61 formed in the wafer 92 for base and the lead electrodes 41a, 42b formed on the other surface side of the wafer 91 for element are housed in the receiving portions 62a, 62b formed in the wafer 92 for base. Then, by heating the solder portions by laser, the solder is melted, whereby the wafer 91 for element is joined to the front surface of the wafer 92 for base.

Next, on the front surface of the wafer 91 for element, solder such as AuSi, AuS, or AuGe is deposited on regions except the regions where the vibrating portions 32 and the support portions 33a, 33b are formed. Thereafter, the wafer 93 for cover is bonded on the front surface of the wafer 91 for element in a vacuum atmosphere, whereby the vibrating portions 32 and the support portions 33a, 33b formed on the wafer for element are housed in the recessed portions 51 formed in the wafer 93 for cover. Then, by heating the solder portion by laser, the solder is melted, whereby the wafer 93 for cover is joined to the front surface of the wafer 91 for element.

Next, the conduction electrodes 7a, 7b are formed by sputtering on the inner circumferential surfaces of the through holes 63a, 63b formed in the wafer 92 for base and the conduction electrodes 7a, 7b are electrically connected to the lead electrodes 41a, 41b which are in close contact with the upper surfaces of the portions, in the receiving portions 62a, 62b, where the through holes 63a, 63b are formed. Thereafter, the electrode pads 8a, 8b are formed on the outer bottom surface of the wafer 92 for base so as to cover the whole through holes 63a, 63b respectively. Thereafter, as shown in FIG. 6, the front surface of the wafer 93 for cover is covered by a dicing tape 94, and the whole structure is cut along dicing lines 95 by a not-shown dicing saw from above the dicing tape 94. Consequently, the package-type quartz resonators shown in FIG. 1 are cut out one by one from the wafers stacked in layers.

Figure 6:
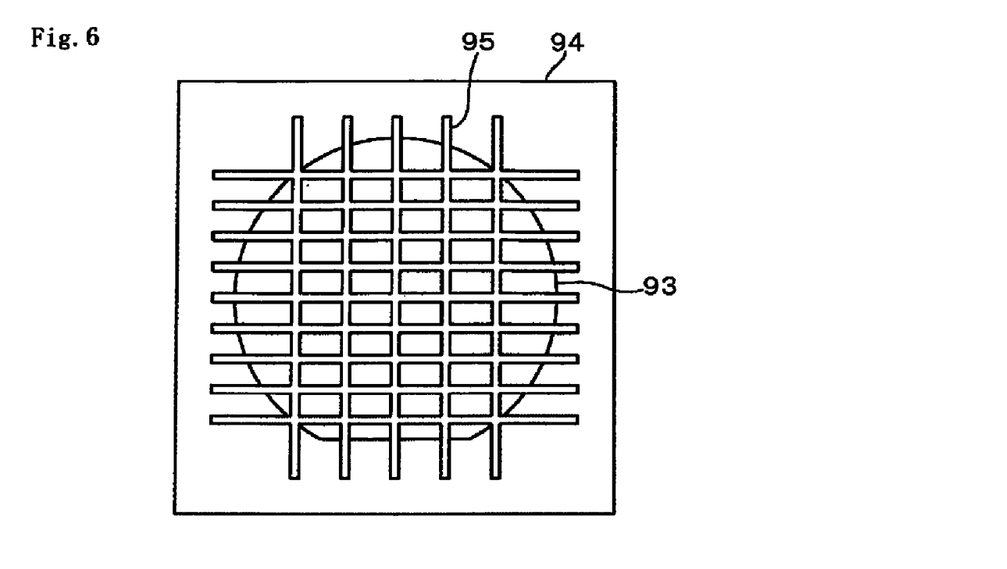
FIG. 6 is a schematic plane view showing how the substrate is cut into individual package-type quartz resonators.

The above-described embodiment is suitable for mass production since the packaging at the wafer stage is possible as shown in FIG. 5 and FIG. 6. In the package-type quartz resonator being a mass produced product, the receiving portions 62a, 62b housing the lead electrode 4a and the other lead electrode 4b formed on the frame portion 31 on the other surface side of the quartz substrate 3 are formed in the base 6, and therefore, when the frame portion 31 on the other surface side of the quartz substrate 3 is joined to the base 6, the lead electrodes 4a, 4b are interposed between the receiving portions 62a, 62b and the frame portion 31 on the other surface side of the quartz substrate 3 in a close contact state, so that the space of the recessed portion 61 is airtightly sealed. Therefore, only by joining the cover 5 to the one surface side of the quartz substrate 3 and joining the base 6 to the other surface side of the quartz substrate 3, it is possible to easily airtightly seal the quartz substrate 3 on whose surfaces the excitation electrodes 4a, 4b and the lead electrodes 41a, 41b are formed, which can avoid the complication of the manufacturing processes.

Further, in the package-type quartz resonator in FIG. 1, insulating members, for example, low melting point glass, or conductive members, for example, metal may be buried in the through holes 63a, 63b formed in the receiving portions 62a, 62b of the base 6. By thus burying the insulating members or the conductive members in the through holes 63a, 63b, it is possible to join the quartz substrate 3 and the base 6 more airtightly. The insulating members or the conductive members are buried in the through holes 63a, 63b after the conduction electrodes 7a, 7b are formed on the inner circumferential surfaces of the through holes 63a, 63b. Thereafter, the electrode pads 8a, 8b are provided on the outer surface of the base so as to cover the whole through holes 63a, 73b.

The invention claimed is:

1. A package-type piezoelectric resonator in which a vibrating portion is provided in a space airtightly sealed by a cover and a base, the piezoelectric resonator comprising:
   a piezoelectric substrate in which the vibrating portion and a frame portion surrounding the vibrating portion via a gap are integrally formed via a support portion;
   one excitation electrode and another excitation electrode formed on one surface side and another surface side of the vibrating portion respectively;
   one lead electrode connected to said one excitation electrode and led out from one edge side of the vibrating portion to the frame portion on the other surface side of said piezoelectric substrate via the support portion;
   another lead electrode connected to said other excitation electrode and led out to a position that is separated in a crosswise direction from said one lead electrode on the frame portion on the other surface side of said piezoelectric substrate via the support portion;
   the cover having a recessed portion housing the vibrating portion and the support portion; and
   the base having a recessed portion housing the vibrating portion and the support portion, wherein:
   said base has: stepped surfaces which are formed at portions respectively facing said one and other lead electrodes on an inner circumferential edge side on a top face of an annular protruding wall surrounding the recessed portion of said base so as to be lower than another portion of the top face of said annular protruding wall by a dimension that is slightly less than film thickness of said lead electrodes; one through hole and another through hole formed at positions, in the stepped surfaces, not communicating with a space in the recessed portion of said base and being open to the piezoelectric substrate at an outer surface of said base at said stepped surfaces;
   a top face of an annular protruding wall of said cover and a top face of an annular protruding wall of the base are joined with the frame portion of said piezoelectric substrate trapped therebetween;
   one lead electrode formed onto an other side of the frame portion of said piezoelectric substrate is positioned extending across an opening on the stepped surface side of said one through hole so as to close said opening, and another lead electrode formed onto the other side of the frame portion of said piezoelectric substrate, is positioned extending across an opening on the stepped surface side of said other through hole so as to close said opening, the lead electrodes being pressed into and sunken into the stepped surface whereby an airtight seal is achieved between the through holes and the recessed portion of the base; and by forming conduction electrodes on the inner circumferential faces of the one through hole and the other through hole and on the surfaces of the lead electrodes that cover the through holes, the external electrodes and the lead electrodes are electrically connected via the conduction electrodes.

2. The package-type piezoelectric resonator according to claim 1, wherein said piezoelectric substrate, said cover, and said base are each made of quartz crystal.

3. The package-type piezoelectric resonator according to claim 1, wherein an insulating member or a conductive member is buried in each of the through holes.

4. The package-type piezoelectric resonator according to claim 1, wherein the external electrodes are provided on the outer surface of said base so as to cover the through holes.

5. A method of manufacturing the package-type piezoelectric resonator according to claim 1, the method comprising:

by using a first wafer made of a piezoelectric material having a large number of substrate regions in each of which the vibrating portion and a frame portion formation region to be the frame portion surrounding the vibrating portion via the gap are integrally formed via the support portion, forming the one excitation electrode and the other excitation electrode on the one surface side and the other surface side of the vibrating portion respectively, and forming the one lead electrode which is connected to the one excitation electrode and is led out from the one edge side of the vibrating portion to the frame portion on the other surface side of the piezoelectric substrate via the support portion and the other lead electrode which is connected to the other excitation electrode and is led out to the frame portion on the other surface side of the piezoelectric substrate via the support portion;

forming recessed portions on a second wafer to form said cover, wherein the formed recessed portions are positioned to allow the cover to house the vibrating portion and the support therein and correspond to an arrangement pattern of the substrate regions of the first wafer;

forming, on a third wafer, a large number of regions each of which is to be the base having the recessed portion housing the vibrating portion and the support portion, so as to correspond to the arrangement pattern of the substrate regions of the first wafer, forming the stepped surfaces which are formed lower than an upper surface of a region to be an annular protruding portion by a dimension corresponding to the thickness of the lead electrodes, at portions facing the one and other lead electrodes in each of the regions to be the inner circumferential edge side on the top face of the annular protruding portion surrounding the recessed portion of the base, and forming the through holes opened in the outer surface of each of the bases, at positions, in the stepped surfaces, not communicating with the space in the recessed portion of the base;

joining the second wafer and the third wafer on an upper surface and a lower surface of the first wafer respectively in a stacked manner, while aligning the vibrating portions of the second wafer, the recessed portions of the first wafer, and the recessed portions of the third wafer to one another;

thereafter forming, on the inner circumferential faces of the through holes and the faces of the lead electrodes that cover the through holes of the third wafer, the conduction electrodes electrically connecting the lead electrodes and the external electrodes, and forming the external electrodes of each of the package-type piezoelectric resonators, on a surface opposite the recessed portions of the third wafer; and thereafter cutting a stack of the wafers to divide the stack into the package-type piezoelectric resonators.

6. The method of manufacturing the package-type piezoelectric resonator according to claim 5, further comprising:

after forming the conduction electrodes, burying insulating members or conductive members in the through holes; and thereafter providing electrode pads electrically connected to the conduction electrodes on the outer surface of each of the bases so as to cover the through holes.

* * * * *